United States Patent [19]

Takahara et al.

[11] Patent Number: 5,630,918

[45] Date of Patent: May 20, 1997

[54] ITO SPUTTERING TARGET

[75] Inventors: Toshiya Takahara, Yokohama; Akio Kondo, Konan, both of Japan

[73] Assignee: Tosoh Corporation, Japan

[21] Appl. No.: 463,555

[22] Filed: Jun. 5, 1995

[30] Foreign Application Priority Data

Jun. 13, 1994 [JP] Japan ................ 6-130247

[51] Int. Cl.$^6$ .................................................. C23C 14/34
[52] U.S. Cl. ........................... 204/298.13; 204/192.29
[58] Field of Search ............................ 204/192.29, 298.13

[56] References Cited

FOREIGN PATENT DOCUMENTS 5-148635  6/1993  Japan ................. 204/298.13

*Primary Examiner*—Aaron Weisstuch
*Attorney, Agent, or Firm*—Nixon & Vanderhye

[57] ABSTRACT

An ITO sputtering target comprised of indium oxide and tin oxide and having a density of at least 6.4 g/cm$^3$, wherein the center line average height ($R_a$) of the surface to be sputtered is not larger than 0.8 μm, and at least one property selected from the following (i), (ii) and (iii) is satisfied: (i) the maximum height ($R_{max}$) is not larger than 7.0 μm, (ii) the ten point average height ($R_z$) is not larger than 6.0 μm, and (iii) the maximum height ($R_t$) of said surface as expressed by the distance between two lines which are parallel to the center line of a surface roughness curve drawn as measured at a sample length of 2.5 mm, and which sandwich said surface roughness curve, is not larger than 6.5 μm. Preferably, $R_a$ and the or each property ($R_{max}$, $R_z$ or $R_t$) selected from (i), (ii) and (iii) satisfy the formula: $R_a \times (R_{max}, R_z$ or $R_t) \leq 3.0$ μm$^2$.

7 Claims, 6 Drawing Sheets

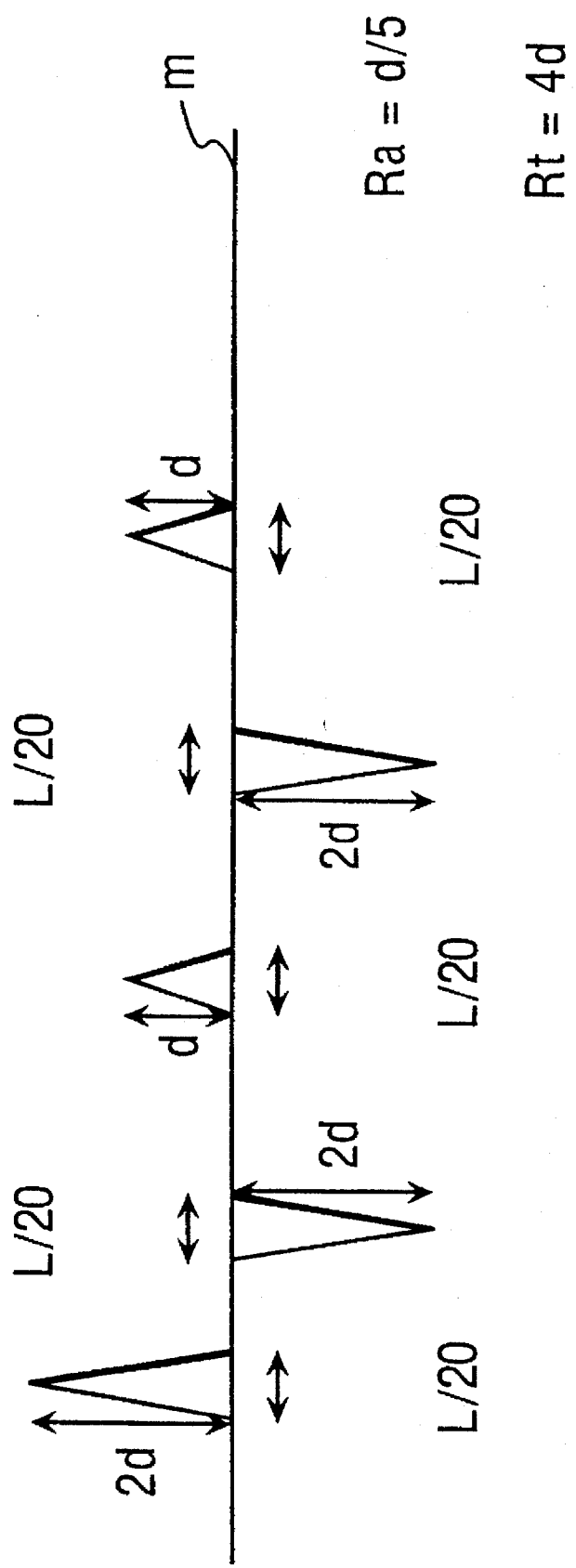

ITO SPUTTERING TARGET

BACKGROUND OF THE INVENTION (1) Field of the Invention

This invention relates to a sputtering target used for a transparent electrically conductive thin film.

(2) Description of the Related Art

An indium tin oxide (hereinafter abbreviated to "ITO") thin film is characterized as possessing a high electrical conductivity and a high transmittance and in that precision working thereof can be easily conducted, and therefore, the ITO thin film is widely used as, for example, a transparent electrode for a flat panel display device, a window material of a solar cell, and an antistatic conductive film. In recent years, flat panel display devices including a liquid crystal display device have become large-sized and more precise, and therefore, there is an increasing demand for an ITO thin film used as a transparent electrode for a flat panel display device.

The methods for making an ITO film are classified into two types, i.e., a chemical film-deposition method such as a spray-thermal decomposition method or a chemical vapor deposition method, and a physical film-deposition method such as an electron-beam deposition method or a sputtering method. Of these, the sputtering method is widely used in various fields because an ITO thin film having a large size and reliable performance can be easily fabricated.

In the sputtering method for fabricating an ITO thin film, sputtering targets are used which include a metal alloy target composed of metallic indium and metallic tin (this metal alloy target is hereinafter abbreviated to "IT target") and a composite oxide target composed of indium oxide and tin oxide (this composite target is hereinafter abbreviated to "ITO target"). The ITO target is more popularly used than the IT target because changes with time of resistance and transmittance of the ITO thin film fabricated by using the ITO target are minor and the film-fabricating conditions can be easily controlled.

When an ITO target is continuously sputtered in a mixed gas atmosphere composed of argon and oxygen, a black deposit called a "nodule" is formed on the target surface with an increase of the integrated sputtering time. The black deposit is believed to be a lower oxide of indium and is formed in the periphery of the erosion area of the target. It is known that the nodule deposition occasionally leads to arcing upon sputtering and causes generation of undesirable particles. Consequently, when sputtering is continuously carried out, contaminants are found in the formed thin film, which lead to reduction of the yield of flat panel displays of liquid display devices and cause failure of elements. The failure of elements is serious in the field where a high precision is required, such as flat panel displays.

To remove the contaminants from the thin film, a cleaning operation is conducted at regular intervals. This leads to reduction of productivity. It is therefore eagerly desired to provide an ITO target wherein the nodule deposition is minimized.

To provide such ITO targets wherein the nodule deposition is minimized, a proposal has been made in Japanese Unexamined Patent Publication No. 5-148635 wherein powdery indium oxide and powdery tin oxide are compression-molded together, the molded mixture is sintered in an atmosphere having an oxygen partial pressure of at least 1 atm, and the sintered product is subjected to machine finishing by a conventional procedure whereby an ITO target having a center line, average surface height (Ra) of not larger than 0.5 µm is obtained. However, it now has been found that there is a great variation among the thus-produced ITO targets in the amount of nodules deposited when the ITO targets having an Ra of not larger than 0.5 µm, produced by the proposed method, are sputtered under the same conditions.

SUMMARY OF THE INVENTION

In view of the foregoing, a primary object of the present invention is to provide improved ITO sputtering targets, in which the nodule deposition is prevented or minimized and there is no great variation among the targets in the amount of nodules deposited.

In accordance with the present invention, there is provided an ITO sputtering target comprising indium oxide and tin oxide and having a density of at least 6.4 g/cm³, wherein the center line average height ($R_a$) of the surface to be sputtered is not larger than 0.8 µm, and at least one of the following requirements for surface roughness parameters (i), (ii) and (iii) is satisfied:

(i) the maximum height ($R_{max}$) of said surface is not larger than 7.0 µm, (ii) the ten point average height ($R_z$) of said surface is not larger than 6.0 µm, and (iii) the maximum height ($R_t$) of said surface as expressed by the distance between two lines which are parallel to the center line of a surface roughness curve drawn as measured at a sample length of 2.5 mm, and which sandwich said surface roughness curve, is not larger than 6.5 µm.

Preferably the center line average height ($R_a$) and the or each requirement for surface roughness parameter ($R_{max}$, $R_z$ or $R_t$) selected from the three requirements (i), (ii) and (iii) satisfy the following formula (1):

$$R_a \times (R_{max}, R_z \text{ or } R_t) \leq 3.0 \text{ µm}^2 \qquad (1).$$

BRIEF DESCRIPTION OF THE DRAWINGS

FIGS. 5 and 6 show the relationship of the surface profile of the ITO target to be sputtered with the center line average height ($R_a$) and maximum height ($R_t$) of the target surface to be sputtered.

DESCRIPTION OF THE PREFERRED EMBODIMENTS

The inventors have made extensive researches to provide improved ITO sputtering targets characterized in that the nodule deposition is minimized and there is no great variation among the targets in the amount of nodules deposited, and obtained the following findings, based on which the present invention has been completed.

First, it was found that, when ITO targets have a center line average height ($R_a$; which also is referred to as "arithmetical mean deviation of the profile") of not larger 0.5 µm, the amount of nodules greatly varies depending upon the particular surface roughness parameters, that is, maximum height of the profile ($R_{max}$), ten point average height ($R_z$)

(i.e., height of the profile irregularities at ten points) and maximum height ($R_t$, as defined above), and, the smaller the $R_{max}$, $R_z$ and $R_t$, the more reduced the amount of nodules. Further, it was found that $R_{max}$, $R_z$ and $R_t$ greatly depend upon the conditions of the machine ground finish step.

Figure 1:
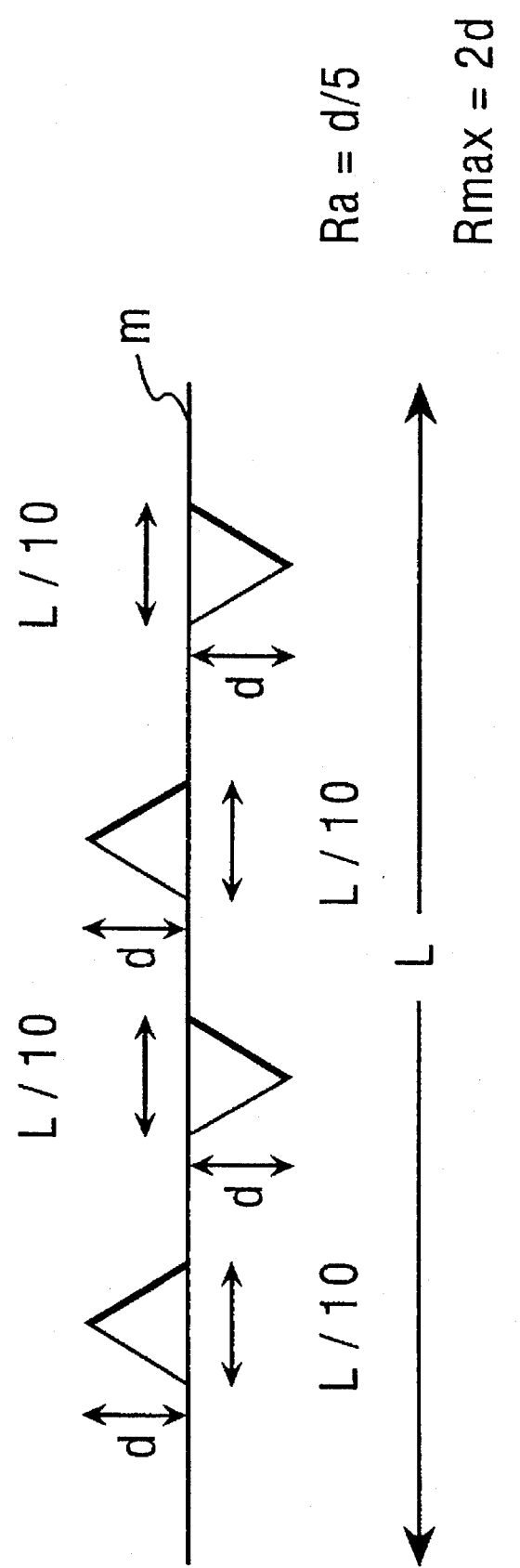
FIGS. 1 and 2 show the relationship of the surface profile of the ITO target to be sputtered with the center line average height ($R_a$) and maximum height ($R_{max}$) of the target surface to be sputtered.
Figure 2:
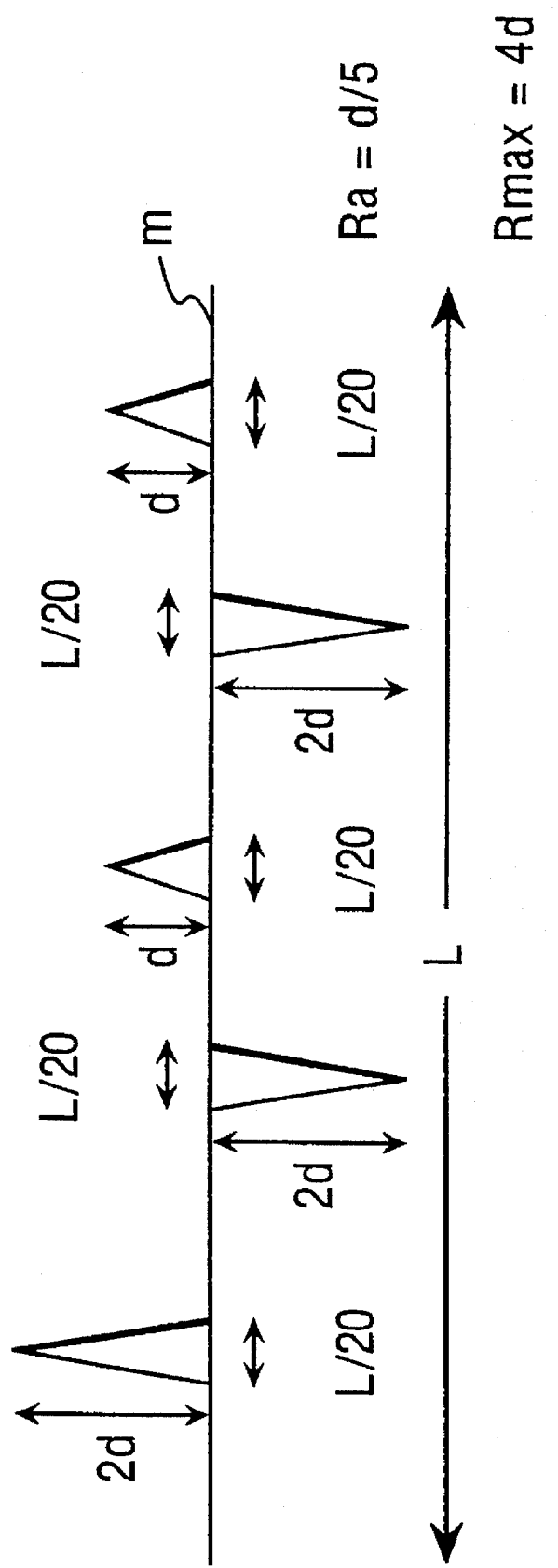
Figure 3:
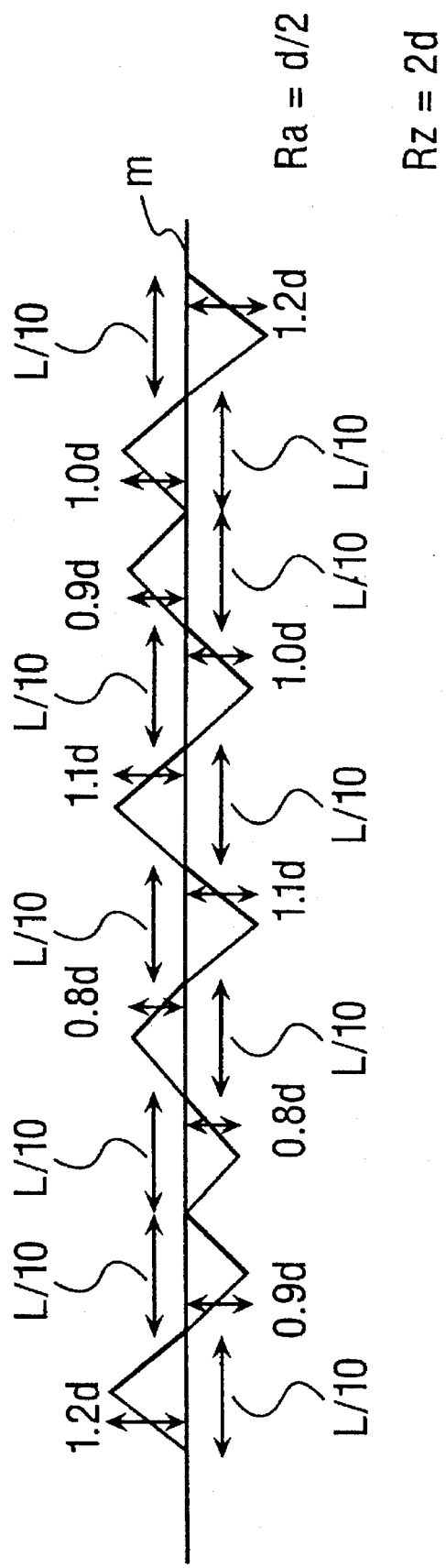
FIGS. 3 and 4 show the relationship of the surface profile of the ITO target to be sputtered with the center line average height ($R_a$) and ten point average height ($R_z$) of the target surface to be sputtered.
Figure 4:
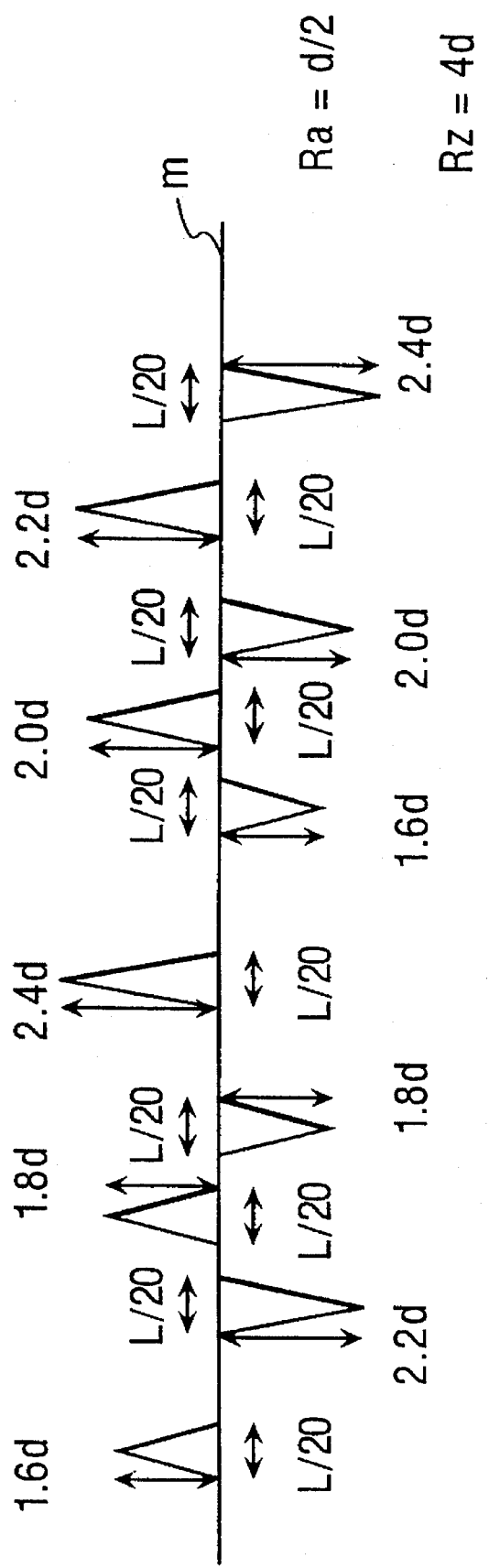
Figure 5:
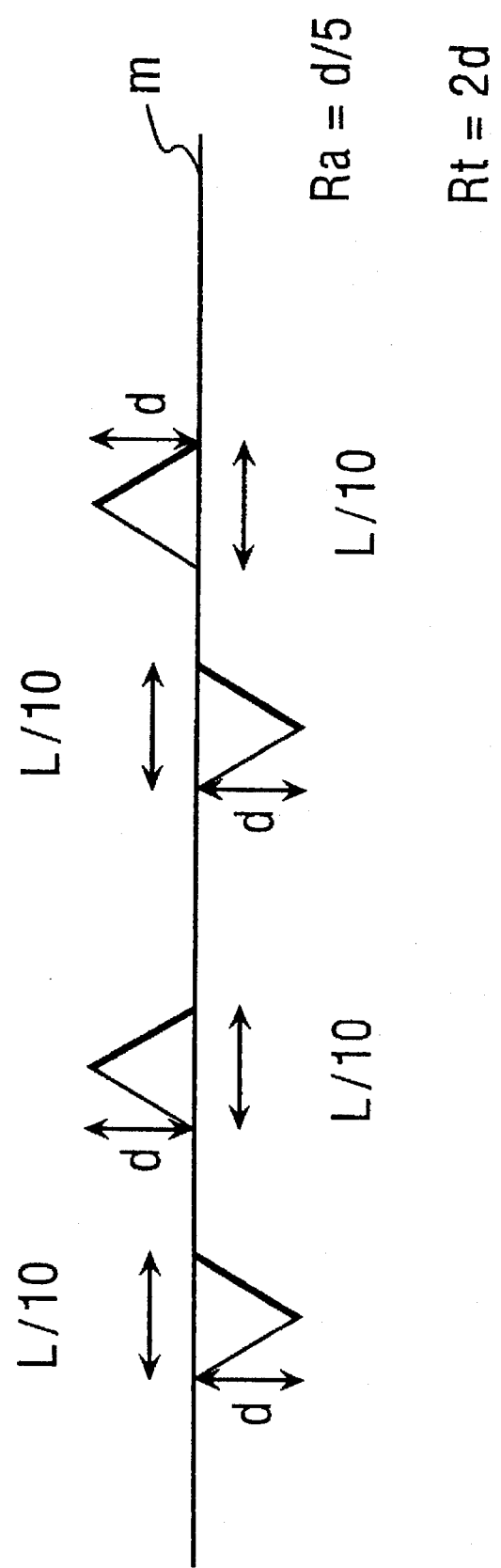

The surface roughness will be explained with reference to the accompanying drawings, which illustrate states under which, although $R_a$ of the target surfaces is of the same magnitude the $R_{max}$, $R_z$ and $R_t$ thereof are different among the target surfaces. In FIG. 1 to FIG. 6, "m" represents a center line, i.e., average line, of the profile, and "L" in FIGS. 1 and 2 represents a sample length. FIG. 1, FIG. 3 and FIG. 5 show surface profiles wherein $R_a$ in each profile is of the same magnitude, and $R_{max}$, $R_z$ and $R_t$ thereof are small, and thus the target surface is flat. 2, FIG. 4 and FIG. 6 show surface profiles wherein $R_a$ in each profile is of the same magnitude, and $R_{max}$, $R_z$ and $R_t$ are large, and thus the target surface is rough. In the surface profiles shown in FIGS. 1, 2, 3, and 4, there is no undulation curve having a large wave length.

Further, the inventors prepared ITO targets having a smooth surface by conducting a machine finish and further surface-finishing to remove surface defects inevitably produced by the machine finish, and conducted researches as to the relationship of the amount of nodules with the density and surface roughness of the targets to thereby obtain the following findings (i) through (vii).

(i) When the target has a density lower than 6.4 g/cm³, the nodule deposition occurs from the initial stage of sputtering irrespective of the magnitudes of $R_a$, $R_{max}$, $R_z$ and $R_t$.

(ii) When the target has a density of at least 6.4 g/cm³, an $R_a$ of not larger than 0.8 μm and an $R_{max}$ of not larger than 7.0 μm, the nodule deposition is very reduced.

(iii) When the target has a density of at least 6.4 g/cm³, an $R_a$ of not larger than 0.8 μm and an $R_{max}$ of not larger than 7.0 μm, and further where $R_a$ and $R_{max}$ satisfy the following formula (2):

$$R_a \times R_{max} \leq 3.0 \text{ μm}^2 \qquad (2),$$

the nodule formation is minimized.

(iv) When the target has a density of at least 6.4 g/cm³, an $R_a$ of not larger than 0.8 μm and an $R_z$ of not larger than 6.0 μm, the nodule deposition is very reduced.

(v) When the target has a density of at least 6.4 g/cm³, an $R_a$ of not larger than 0.8 μm and an $R_z$ of not larger than 6.0 μm, and further where $R_a$ and $R_z$ satisfy the following formula (3):

$$R_a \times R_z \leq 3.0 \text{ μm}^2 \qquad (3),$$

the nodule formation is minimized.

(vi) When the target has a density of at least 6.4 g/cm³, an $R_a$ of not larger than 0.8 μm and an $R_t$ of not larger than 6.5 μm, the nodule deposition is very reduced.

(vii) When the target has a density of at least 6.4 g/cm³, an $R_a$ of not larger than 0.8 μm and an $R_t$ of not larger than 6.5 μm, and further where $R_a$ and $R_t$ satisfy the following formula (4):

$$R_a \times R_t \leq 3.0 \text{ μm}^2 \qquad (4),$$

the nodule formation is minimized.

The ITO sputtering target of the present invention will now be described in detail.

Preferably the surface of the ITO sputtering target of the present invention to be sputtered at least one of the following surface roughness requirements (I), (II) and (III).

(I) The center line average height ($R_a$) is not larger than 0.65 μm, and the maximum height ($R_{max}$) is not larger than 5.0 μm.

(II) The center line average height ($R_a$) is not larger than 0.65 μm, and the ten point average height ($R_z$) is not larger than 5.0 μm.

(III) The center line average height ($R_a$) is not larger than 0.65 μm, and the maximum height ($R_t$) is not larger than 5.5 μm.

There are no permissible lower limits for the values of $R_a$, $R_{max}$, $R_z$ and $R_t$, but practically acceptable lower limits are usually $R_a$=about 0.03 μm, $R_{max}$=about 0.4 μm, $R_z$=about 0.3 μm, and $R_t$=about 0.4 μm.

The ITO sputtering target of the present invention is made by the following method.

A binder and other additives are preferably incorporated in a mixture of powdery indium oxide and powdery tin oxide or in powdery ITO, and the resulting mixture is molded, for example, by a press molding or casting method. The powdery materials used should preferably have an average particle diameter of not larger than 1.5 μm, more preferably in the range of 0.1 to 1.5 μm. If the average particle diameter is too large, the density of the ITO target is lower than 6.4 g/cm³. The content of tin oxide in the mixture of powdery indium oxide and powdery tin oxide or in the powdery ITO is preferably in the range of 5 to 15% by weight based on the weight of the mixture or ITO. When the content of tin oxide is in this range, the ITO thin film made by sputtering has a desirably reduced resistivity.

If desired, the thus-obtained molding is densified, for example, by a cold isostatic pressing (CIP) method. The cold isostatic press is preferably carried out at a pressure of at least 2 ton/cm², more preferably in the range of at least 2 to 3 ton/cm². If the molding has been made by a casting method, the molding is preferably subjected to a treatment for removing residual water and residual organic matter such as a binder, after the molding is densified. Even when the molding has been made by press molding, if the molding contains a binder incorporated therein, it is preferable to conduct the treatment for removal of residual binder.

Then the molding is sintered in a furnace. The sintering procedure and conditions are not particularly limited, provided that a sintered product having a density of at least 6.4 g/cm³ is obtained. In view of the equipment cost, the sintering is carried out in an air atmosphere. However, other conventional procedures such as a hot-pressing (HP) method, a hot isostatic pressing (HIP) method and an oxygen-pressurized sintering method can be adopted. The sintering temperature is preferably in the range of 1,450° to 1,650° C. for obtaining the intended high density and suppressing the evaporation of tin oxide. The sintering atmosphere is preferably air or pure oxygen. The sintering time is usually at least 5 hours, preferably 5 to 30 hours, for obtaining the intended high density.

The sintered product having a density of at least 6.4 g/cm³ is then machined to the desired target shape. The surface roughness of the as-machined surface is not particularly limited, but it is preferable that $R_a$ of the as-machined surface to be sputtered is not larger than 2.0 μm, and at least one of $R_{max}$, $R_z$ and $R_t$ thereof is not larger than 30 μm. When the surface roughness of the as-machined surface is large, a long working time is required for grinding the surface in the succeeding surface-finishing step and thus the productivity is reduced.

The as-machined surface to be sputtered is then subjected to a surface-grinding finish. As the procedure for the surface-grinding finish, a wet surface finish is preferable because the target surface is damaged to the least extent. As abrasive materials used for surface grinding-finish, there can be mentioned abrasive paper or cloth coated with a silicon carbide abrasive grain and a slurry containing an alumina or diamond abrasive grain. The particle size of the abrasive grain used is not particularly limited. But, if an abrasive grain having a too large particle size is used, for example, an abrasive paper coated with an abrasive grain having an average particle diameter of at least 67 µm is used, a target surface having the intended reduced surface roughness cannot be obtained. It is to be noted, however, that, if an abrasive grain having a too small particle diameter is used, it requires a substantially long time to complete the surface-grinding finish, and the productivity is lowered.

Therefore, it is preferable for the surface-grinding finish that an abrasive paper coated with an abrasive grain having a relatively larger particle diameter, e.g., an average particle diameter of 46 µm, is used in the initial stage, and then abrasive grains of reduced average particle diameters are used in order of particle size spanning from large size to small size in the succeeding stages. A target surface having the intended reduced surface roughness can be obtained usually by using an abrasive paper coated with an abrasive grain having an average particle diameter of not larger than 31 µm in the final finishing stage, although the permissible particle size of the abrasive grains varies depending upon the particular density of the target and the particular sintered particle diameter.

For obtaining preferable ITO sputtering targets which satisfy at least one of the following surface roughness requirements (I'), (II') and (III'), it is preferable to use an abrasive paper coated with an abrasive grain having an average particle diameter of not larger than 31 µm in the final finishing stage using abrasive paper, and further use a slurry containing alumina or diamond abrasive grains having an average particle diameter of not larger than 0.3 µm in the additional final finishing stage using an abrasive slurry.

(I') $R_a \leq 0.8$ µm, $R_{max} \leq 7.0$ µm, and $R_a \times R_{max} \leq 0.3$ µm$^2$.

(II') $R_a \leq 0.8$ µm, $R_z \leq 6.0$ µm, and $R_a \times R_z \leq 0.3$ µm$^2$.

(III') $R_a \leq 0.8$ µm, $R_6 \leq 6.5$ µm, and $R_a \times R_t \leq 0.3$ µm$^2$.

There is no critical upper limit for the density of the ITO sputtering target of the present invention, but usually the practically realizable highest density is approximately 7.15 g/cm$^3$.

The invention will now be specifically described by the following examples that illustrate only embodiments of the invention and by no means limit the scope of the invention.

The center line average height ($R_a$) (which also is referred to as "arithmetical mean deviation of the profile"), maximum height ($R_{max}$) and ten point average height ($R_z$) (i.e., height of the profile irregularities in ten points) of the target surface to be sputtered are determined according to Japanese Industrial Standard (JIS) B0601.

The maximum height ($R_t$) was expressed by the distance between two lines which are parallel to the center line of a surface roughness curve drawn as measured at a sample length of 2.5 mm, and which sandwich said surface roughness curve.

The conditions for determining $R_a$, $R_{max}$, $R_z$ and $R_t$ are recited in Table 1.

TABLE 1

| $R_a$ | Cut-off value: | 0.8 mm |
| | Measurin length: | 2.5 mm |
| | Load applied: | 20 mg |

TABLE 1-continued

| | Probe diameter: | 0.1 µm |
| | Feed rate: | 100 µm/sec |
| $R_{max}$ | Measuring length: | 0.25 mm ($R_{max} \leq 0.8$ µm) |
| | | 0.8 mm (0.8 µm < $R_{max} \leq 6.3$ µm) |
| | | 2.5 mm (6.3 µm < $R_{max} \leq 25$ µm) |
| | Load applied: | 20 mg |
| | Probe diameter: | 0.1 µm |
| | Feed rate: | 100 µm/sec |
| $R_z$ | Measuring length: | 0.25 mm ($R_z \leq 0.8$ µm) |
| | | 0.8 mm (0.8 µm < $R_z \leq 6.3$ µm) |
| | | 2.5 mm (6.3 µm < $R_z \leq 25$ µm) |
| | Load applied: | 20 mg |
| | Probe diameter: | 0.1 µm |
| | Feed rate: | 100 µm/sec |
| $R_t$ | Cut-off value: | 0.8 mm |
| | Measuring length: | 2.5 mm |
| | Load applied: | 20 mg |
| | Probe diameter: | 0.1 µm |
| | Feed rate: | 100 µm/sec |

EXAMPLE 1

In a pot for ball milling having an inner volume of 5 liters, 540 g of powdery indium oxide having a purity of 99.99% and an average particle diameter of 1.3 µm and 60 g of powdery tin oxide having a purity of 99.99% and an average particle diameter of 0.7 µm were introduced. Then 2 kg of nylon bails having a diameter of 10 mm were introduced in the pot and dry ball milling was conducted at a revolution of 50 rpm for 5 hours to prepare a mixed powder. The mixed powder was mixed together with water, dispersant and a binder to prepare an aqueous slurry. A plastic casting mold having an inner diameter of 130 mm and an inner height of 10.5 mm was charged with the aqueous slurry to make a molding having a diameter of 130 mm and a height of 10.5 mm. The molding was placed in a drying oven where the molding was maintained at 450° C. for 10 hours to remove residual water and organic substances. Then the molding was subjected to a cold isostatic pressing (CIP) treatment at a pressure of 3 ton/cm$^2$ to obtain a molding having a density of 4.2 g/cm$^3$, Then the molding was sintered in an air furnace under the following conditions.

Sintering temperature: 1,450° C.

Temperature elevating rate: 25° C./hr

Sintering time: 15 hrs

The sintered product had a density of 6.44 g/cm$^3$ as measured by the Archimedian method. The sintered product was machined into a size having a diameter of 76.2 mm and a thickness of 5.1 mm by using a lathe. The machined surface to be sputtered had a surface roughness such that $R_a=1.2$ µm, $R_{max}=14.0$ µm, $R_z=12.7$ µm and $R_t=13.1$ µm. The surface to be sputtered was subjected to a surface finish using a wet-type rotary abrasive finisher under the following conditions.

Abrasive material: two kinds of abrasive paper with abrasive particles of average particle diameters of 46 µm and 31 µm)

Revolution of abrasive material: 300 rpm

Revolution of sintered product: 150 rpm

Load applied: 66 g/cm$^2$

Finishing time: 5 min/each stage

Order of finishing: first particle diameter of 46 µm and then particle diameter of 31 µm The determination of surface roughness of the finished surface to be sputtered revealed that $R_a=0.8$ µm, $R_{max}=6.8$ μm, $R_z$=5.8 μm and $R_t$=6.5 μm. The finished sintered product was bonded to a backing plate to fabricate a target. Using the target, sputtering was carried out under the following conditions.

DC power: 120 W (2.6 W/cm²)
Gas pressure: 0.5 Pa
Flow rate of argon gas: 50 SCCM
Flow rate of oxygen gas: 0.6 SCCM The sputtering was continued under the above-recited conditions. When 30 hours elapsed from the commencement of discharge, a nodule deposit was not found. Thereafter, deposition of only very minor amount of nodules was observed.

On an ITO thin film having a thickness of 200 nm, which was formed at a substrate temperature of 200° C. by employing the above-mentioned sputtering conditions, a line-and-space pattern having lines with a width of 10 μm was formed by using a resist. The ITO thin film was then subjected to etching by using an etching solution composed of hydrochloric acid, nitric acid and water. Etching failure was observed only at the end of sputtering of the target and only to a very slight extent.

EXAMPLE 2

An ITO molding was made by the same procedure as described in Example 1. The molding was sintered in a pure-oxygen atmosphere at normal pressures in a furnace under the following conditions.

Sintering temperature: 1,600° C.
Temperature elevating rate: 25° C./hr
Sintering time: 20 hrs
Flow rate of oxygen: 5 liter/min The sintered product had a density of 6.94 g/cm³ as measured by the Archimedian method. The sintered product was machined into a size having a diameter of 76.2 mm and a thickness of 5.1 mm by using a lathe. The machined surface to be sputtered had a surface roughness such that $R_a$=0.5 μm, $R_{max}$=10.5 μm, $R_z$=9.4 μm and $R_t$=10.2 μm. The surface to be sputtered was subjected to a surface finish using a wet-type rotary abrasive finisher under the following conditions.

Abrasive material: four kinds of abrasive paper with abrasive particles of average particle diameters of 46 μm, 31 μm, 22 μm and 18 μm), and an aqueous slurry of powdery alumina having an average particle diameter of 0.06 μm Revolution of abrasive material: 300 rpm
Revolution of sintered product: 150 rpm
Load applied: 66 g/cm²
Finishing time: 5 min/each stage
Order of finishing: first particle diameter=46 μm, second particle diameter=31 μm, third particle diameter=22 μm, fourth particle diameter=18 μm, and final alumina slurry The determination of surface roughness of the finished surface to be sputtered revealed that $R_a$=0.4 μm, $R_{max}$=4.8 μm, $R_z$=3.7 μm and $R_t$=4.5 μm. The finished sintered product was bonded to a backing plate to fabricate a target. Using the target, sputtering was carried out continuously under the same conditions as those employed in Example 1. Nodule deposits were substantially not found.

On an ITO thin film having a thickness of 200 nm, which was formed at a substrate temperature of 200° C. by employing the above-mentioned sputtering conditions, a line-and-space pattern having lines with a width of 10 μm was formed by using a resist. The ITO thin film was then subjected to etching by using an etching solution composed of hydrochloric acid, nitric acid and water. Etching failure was not observed irrespective of the duration of sputtering of the target and only to a very slight extent.

EXAMPLE 3

In a pot for ball milling having an inner volume of 5 liters, 555 g of powdery indium oxide having a purity of 99.99% and an average particle diameter of 1.3 μm and 45 g of powdery tin oxide having a purity of 99.99% and an average particle diameter of 0.7 μm were introduced. Then 2 kg of nylon balls having a diameter of 10 mm were introduced in the pot and dry ball milling was conducted at a revolution of 50 rpm for 5 hours to prepare a mixed powder. A binder was incorporated in the mixed powder, and the resulting mixture was introduced in a mold having a 130 mm diameter inner space for press molding, and press-molded at a pressure of 500 kg/cm² to obtain a molding. The molding was placed in a drying oven where the molding was maintained at 100° C. for 10 hours to remove residual organic substances. Then the molding was subjected to a cold isostatic pressing (CIP) treatment at a pressure of 3 ton/cm² to obtain a molding having a density of 4.1 g/cm³.

Then the molding was sintered in a furnace under the following conditions, while an oxygen gas was blown into the furnace at normal pressures.

Sintering temperature: 1,550° C.
Temperature elevating rate: 25° C./hr
Sintering time: 20 hrs
Flow rate of oxygen gas: 3 liters/min The sintered product had a density of 6.69 g/cm³ as measured by the Archimedian method. The sintered product was machined into a size having a diameter of 7.62 mm and a thickness Of 5.1 mm by using a lathe. The machined surface to be sputtered had a surface roughness such that $R_a$=0.9 μm, $R_{max}$=11.2 μm, $R_z$=10.3 μm and $R_t$=11.0 μm. The surface to be sputtered was subjected to a surface finish using a wet-type rotary abrasive finisher under the following conditions.

Abrasive material: three kinds of abrasive paper with abrasive particles of average particle diameters of 46 μm, 31 μm and 22 μm)

Revolution of abrasive material: 300 rpm
Revolution of sintered product: 150 rpm
Load applied: 66 g/cm²
Finishing time: 5 min/each stage
Order of finishing: first particle diameter of 46 μm, second particle diameter of 31 μm, and final particle diameter of 22 μm The determination of surface roughness of the finished surface to be sputtered revealed that $R_a$=0.6 μm, $R_{max}$=5.6 μm, $R_z$=5.1 μm and $R_t$=5.5 μm. The finished sintered product was bonded to a backing plate to fabricate a target. Using the target, sputtering was carried out under the following conditions.

DC power: 120 W (2.6 W/cm²)
Gas pressure: 0.5 Pa
Flow rate of argon gas: 50 SCCM
Flow rate of oxygen gas: 0.6 SCCM The sputtering was continued under the same conditions as those employed in Example 1. Deposition of only a very minor amount of nodules was observed at the end of the lifetime of target.

On an ITO thin film having a thickness of 200 nm, which was formed at a base temperature of 200° C. under the same sputtering conditions as those employed in Example 1, a line-and-space pattern having lines with a width of 10 μm was formed by using a resist. The ITO thin film was then subjected to etching by using an etching solution composed of hydrochloric acid, nitric acid and water. Etching failure was observed only to a very slight extent at the end of sputtering of the target.

COMPARATIVE EXAMPLE 1

An ITO molding was made by the same procedure as described in Example 1. The molding was sintered in an air furnace under the following conditions.

Sintering temperature: 1,400° C.
Temperature elevating rate: 50° C./hr
Sintering time: 4 hrs The sintered product had a density of 6.0 g/cm$^3$ as measured by the Archimedian method. The sintered product was machined into a size having a diameter of 76.2 mm and a thickness of 5.1 mm by using a lathe. The machined surface to be sputtered had a surface roughness such that $R_a$=1.4 μm, $R_{max}$=17.0 μm, $R_z$=16.0 μm and $R_t$=16.8 μm. The surface to be sputtered was subjected to a surface finish using a wet-type rotary abrasive finisher under the following conditions.

Abrasive material: three kinds of abrasive paper with abrasive particles of average particle diameters of 46 μm, 31 μm and 22 μm)
Revolution of abrasive material: 300 rpm
Revolution of sintered product: 150 rpm
Load applied: 66 g/cm$^2$
Finishing time: 5 min/each stage
Order of finishing: first particle diameter=46 μm, second particle diameter=31 μm and final particle diameter=22 μm The determination of surface roughness of the finished surface to be sputtered revealed that $R_a$=1.0 μm, $R_{max}$=9.5 μm, $R_z$=9.2 μm and $R_t$=9.4 μm. The finished sintered product was bonded to a backing plate to fabricate a target. Using the target, sputtering was carried out continuously under the same conditions as those employed in Example 1. When 7.5 hours elapsed from the commencement of discharge, a nodule deposit was found. The nodule deposition drastically increased with an increase in the sputtering time.

On an ITO thin film having a thickness of 200 nm, which was formed at a substrate temperature of 200° C. by employing the same sputtering conditions as those employed in Example. 1, a line-and-space pattern having lines with a width of 10 μm was formed by using a resist. The ITO thin film was then subjected to etching by using an etching solution composed of hydrochloric acid, nitric acid and water. When about 10 hours elapsed from the commencement of the use of target, etching failure was observed. The level of etching failure drastically increased with an increase in the time of using the target.

COMPARATIVE EXAMPLE 2

A sintered ITO product having a density of 6.85 g/cm$^3$ was obtained by substantially the same procedure as that described in Example 2. The sintered product was machined by using a lathe, and thereafter, was fabricated to a target without surface finish. The determination of surface roughness of the surface to be sputtered revealed that $R_a$=0.5 μm, $R_{max}$=11.7 μm, $R_z$=10.6 μm and $R_t$=11.5 μm. Using the target, sputtering was carried out continuously under the same conditions as those employed in Example 1. When 20 hours elapsed from the commencement of discharge, a nodule deposit was found. The nodule deposition drastically increased with an increase in the sputtering time.

On an ITO thin film having a thickness of 200 nm, which was formed at a substrate temperature of 200° C. by employing the same sputtering conditions as those employed in Example 1, a line-and-space pattern having lines with a width of 10 μm was formed by using a resist. The ITO thin film was then subjected to etching by using an etching solution composed of hydrochloric acid, nitric acid and water. When about 25 hours elapsed from the commencement of the use of target, etching failure was observed. The level of etching failure drastically increased with an increase in the time of using the target.

The ITO sputtering target of the present invention is advantageous in that the nodule deposition on the target can be prevented or minimized when sputtered, and there is no great difference in the amount of nodules deposited among the targets. Consequently a cleaning operation of the target surface for removing the nodules is not needed or the frequency time of the cleaning can be drastically reduced. Further, defects in the ITO thin film can be stably prevented or minimized. Therefore, displays such as a liquid crystal display (LCD) can be produced with an enhanced productivity.

What is claimed is:

1. An ITO sputtering target comprising indium oxide and tin oxide and having a density of at least 6.4 g/cm$^3$, wherein the center line average height ($R_a$) of the surface to be sputtered is not larger than 0.8 μm, and at least one property selected from the following surface roughness requirements (i), (ii) and (iii) is satisfied:

(i) the maximum height ($R_{max}$) of said surface is not larger than 7.0 μm, (ii) the ten point average height ($R_z$) of said surface is not larger than 6.0 μm, and (iii) the maximum height ($R_t$) of said surface as expressed by the distance between two lines which are parallel to the center line of a surface roughness curve drawn as measured at a sample length of 2.5 mm, and which sandwich said surface roughness curve, is not larger than 6.5 μm.

2. An ITO sputtering target as claimed in claim 1, wherein the center line average height ($R_a$) and the or each property ($R_{max}$, $R_z$ or $R_t$) selected from the three surface roughness requirements (i), (ii) and (iii) satisfy the following formula (1):

$$R_a \times (R_{max}, R_z \text{ or } R_t) \leq 3.0 \text{ μm}^2 \qquad (1).$$

3. An ITO sputtering target as claimed in claim 1, wherein the center line average height ($R_a$) is at least 0.03 μm and not larger than 0.65 μm.

4. An ITO sputtering target as claimed in claim 1, wherein the maximum height ($R_{max}$) is at least 0.4 μm and not larger than 5.0 μm.

5. An ITO sputtering target as claimed in claim 1, wherein the ten point average height ($R_z$) is at least 0.3 μm and not larger than 5.0 μm.

6. An ITO sputtering target as claimed in claim 1, wherein the maximum height ($R_t$) is at least 0.4 μm and not larger than 5.5 μm.

7. An ITO sputtering target as claimed in claim 1, wherein said sputtering target comprises, based on the weight of the target, 5 to 15% by weight of tin oxide and 95 to 85% by weight of indium oxide.

* * * * *